(12) United States Patent         (10) Patent No.:     US 7,755,375 B2
     Ariyama et al.                (45) Date of Patent:     Jul. 13, 2010

(54) TEST APPARATUS, PROBE CARD, AND TEST METHOD

(75) Inventors: Yuji Ariyama, Tokyo (JP); Shigemi Komagata, Tokyo (JP)

(73) Assignee: Advantest Corporation, Tokyo (JP)

( * ) Notice: Subject to any disclaimer, the term of this patent is extended or adjusted under 35 U.S.C. 154(b) by 155 days.

(21) Appl. No.: 11/971,207

(22) Filed: Jan. 8, 2008

(65)            Prior Publication Data
    US 2009/0174420 A1      Jul. 9, 2009

(51) Int. Cl.
    *G01R 31/02*    (2006.01)
(52) U.S. Cl. .................... 324/754; 324/158.1; 324/73.1
(58) Field of Classification Search ......... 324/754–765; 714/700
    See application file for complete search history.

(56)            References Cited
            U.S. PATENT DOCUMENTS

| 4,746,855 A | * | 5/1988 | Wrinn | ......................... 324/763 |
| 4,929,888 A | * | 5/1990 | Yoshida | ...................... 714/736 |
| 5,225,775 A | * | 7/1993 | Sekino | ..................... 324/158.1 |
| 5,635,846 A | * | 6/1997 | Beaman et al. | ............. 324/754 |
| 6,448,799 B1 | * | 9/2002 | Niwa | .......................... 324/763 |
| 7,064,564 B2 | * | 6/2006 | Kister et al. | ................ 324/715 |

FOREIGN PATENT DOCUMENTS

| JP | 04-259868 | 9/1992 |
| JP | H02-5937 | 10/1993 |
| JP | 09-196970 | 7/1997 |
| JP | 2001-153886 | 6/2001 |
| JP | 2002-257901 | 9/2002 |
| JP | 2004-117247 | 4/2004 |

* cited by examiner

*Primary Examiner*—Vinh P Nguyen
(74) *Attorney, Agent, or Firm*—Jianq Chyun IP Office

(57)            ABSTRACT

There is provided a test apparatus for testing a device under test. The test apparatus includes a plurality of drivers that respectively output a plurality of test signals to a same terminal of the device under test so as to supply, to the same terminal of the device under test, a multiple-valued signal that is generated by combining together the plurality of test signals, and a plurality of probe pins that are provided in a one-to-one correspondence with the plurality of drivers. Here, each of the plurality of probe pins has a top end portion to be electrically connected to the same terminal of the device under test so as to supply a signal output from a corresponding one of the plurality of drivers to the same terminal of the device under test while the test apparatus is testing the device under test, and the top end portion of each probe pin is kept electrically open while the test apparatus is not testing the device under test.

6 Claims, 8 Drawing Sheets

TEST APPARATUS, PROBE CARD, AND TEST METHOD

BACKGROUND

1. Technical Field

The present invention relates to a test apparatus, a probe card and a test method. More particularly, the present invention relates to a test apparatus and a test method for testing a device under test such as a semiconductor circuit, and to a probe card for use in the test apparatus.

2. Description of the Related Art

A known conventional test apparatus for testing a device under test such as a semiconductor circuit includes a plurality of driver/comparator pins that transmit/receive signals to/from the device under test. When the test apparatus supplies test signals to the device under test, each of the plurality of driver/comparator pins can generate a binary test signal and supply the generated binary test signal to the device under test. Here, the binary test signal may be, for example, a signal having a logic pattern formed by binary logic values such as H and L logic values.

When testing the device under test, the test apparatus may be required to supply a multiple-valued (three-valued or higher) test signal to the device under test. In response to this requirement, a driver/comparator pin which allows for multiple-valued test signal generation may be newly added to the test apparatus. This solution, however, increases the cost. Therefore, an alternative solution is suggested which uses the driver/comparator pins which have been already mounted to generate binary test signals for generating multiple-valued test signals.

FIG. 8 illustrates an example of a test apparatus 400 generating a multiple-valued test signal. The test apparatus 400 includes therein a pin electronics section 410 and a probe card 420. The pin electronics section 410 includes therein a plurality of drivers 412 and a plurality of comparators 414. Each driver 412 outputs a binary test signal.

The probe card 420 includes therein a plurality of transmission paths 422 and a needle 424. The transmission paths 422 are provided in a one-to-one correspondence with the drivers 412. Each transmission path 422 transmits therethrough a test signal output from a corresponding one of the drivers 412. The respective top ends of the transmission paths 422 are short-circuited in the probe card 420.

The needle 424 is fixed, by using a solder or the like, at one end thereof to the short-circuited transmission paths 422. The needle 424 is, at the other end thereof, in contact with a terminal of a device under test, so as to supply the test signals received via the transmission paths 422 to the device under test. With such a configuration, by causing the drivers 412 to output the test signals in synchronization with each other, the test apparatus 400 can combine together the test signals in the probe card 420, thereby supplying a multiple-valued test signal to the device under test.

For example, a case is assumed where each driver 412 generates a binary test signal indicating either the H logic (1V) or L logic (0V) and the test apparatus 400 short-circuits the outputs from two drivers 412 to generate a multiple-valued test signal. In this case, the combination signal can take one of three logic values (signal levels) including a logic value (0V) generated when the two drivers 412 both output the L logic, a logic value (0.5V) generated when one of the drivers 412 outputs the H logic and the other driver 412 outputs the L logic, and a logic value (1V) generated when the two drivers 412 both output the H logic.

By using the above-described configuration, it becomes possible to generate a multiple-valued test signal by using driver/comparator pins which are mounted on a conventional test apparatus for generating binary signals. When each transmission path 422 has a different delay amount, however, the test apparatus 400 can not generate an accurate multiple-valued test signal even though each driver 412 outputs the test signal at the same timing.

Therefore, the test apparatus 400 preferably measures in advance the delay amounts of the transmission paths 422, and adjusts the test signal output timings of the drivers 412 in accordance with the measured delay amounts of the transmission paths 422. The test apparatus 400 may measure the delay amounts of the transmission paths 422 by using a time domain reflectometry (TDR) method.

The TDR method measures the delay time of a transmission path by inputting a signal into the transmission path with its top end being kept open and measuring the delay time of the signal which is reflected at the open top end of the transmission path. Since the comparators 414 and the drivers 412 are connected to the same transmission paths 422 in the test apparatus 400, the test apparatus 400 can easily measure the delay times of the transmission paths 422 by referring to the timings at which the drivers 412 output the signals and the timings at which the comparators 414 detect the reflected waves.

Here, the top ends of the transmission paths 422 are short-circuited and fixed to the needle 424 by using a solder or the like in the test apparatus 400 which generates a multiple-valued test signal, as illustrated in FIG. 8. For this reason, the test apparatus 400 can not use the TDR method to measure the delay times of the transmission paths 422. Specifically speaking, the TDR method can not be used to measure the delay times of the transmission paths 422 since the reflected waves are not generated at the top ends of the transmission paths 422.

Note that the test apparatus 400 can measure the total of the delay times of the first and second transmission paths 422-1 and 422-2 by referring to the timing at which the first driver 412-1 outputs a signal and the timing at which the second comparator 414-2 detects the signal. However, the test apparatus 400 can not measure the delay time of each of the first and second transmission paths 422-1 and 422-2. Therefore, the test apparatus 400 has difficulties in adjusting the timing at which each driver 412 outputs a signal. As a result, it has been difficult for the test apparatus 400 to generate an accurate multiple-valued test signal.

SUMMARY

Therefore, it is an object of an aspect of the innovations herein to provide a test apparatus, a probe card and a test method which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary test apparatus may include a test apparatus for testing a device under test. The test apparatus includes a plurality of drivers that respectively output a plurality of test signals to a same terminal of the device under test so as to supply, to the same terminal of the device under test, a multiple-valued signal that is generated by combining together the plurality of test signals, and a plurality of probe pins that are provided in a one-to-one correspondence with the plurality of drivers. Here, each of the plurality of probe pins has a top end portion to be electrically connected to the same terminal of the device under test so as to supply a signal output from a corresponding one of the plurality of drivers to the same terminal of the device under test while the test apparatus is testing the device under test, and the top end portion of each probe pin is kept electrically open while the test apparatus is not testing the device under test.

According to the second aspect related to the innovations herein, one exemplary test apparatus may include a test apparatus for testing a device under test. The test apparatus includes a plurality of drivers that respectively output a plurality of test signals, a pin electronics section that has the plurality of drivers formed therein, a wiring portion that electrically connects together output ends of the plurality of drivers on a substrate of the pin electronics section, so as to generate a multiple-valued signal by combining together the plurality of test signals, and a probe pin that receives the multiple-valued signal transmitted via the wiring portion outside the pin electronics section, and supplies the received multiple-valued signal to the device under test.

According to the third aspect related to the innovations herein, one exemplary probe card may include a probe card for use with a test apparatus that has therein a plurality of drivers respectively outputting a plurality of test signals. The probe card includes a plurality of probe pins that are provided in a one-to-one correspondence with the plurality of drivers. Here, each of the plurality of probe pins has a top end portion electrically connected to a same terminal of the device under test so as to supply a signal output from a corresponding one of the plurality of drivers to the same terminal of the device under test while the test apparatus is testing the device under test, and the top end portion of each probe pin is kept electrically open while the test apparatus is not testing the device under test.

According to the fourth aspect related to the innovations herein, one exemplary test method may include a test method for testing a device under test by using a test apparatus including therein a plurality of drivers outputting a plurality of test signals respectively and a plurality of probe pins supplying the plurality of test signals output from the plurality of drivers to the device under test. Here, the test apparatus causes the plurality of drivers to respectively output a plurality of adjustment signals while top end portions of the plurality of probe pins are kept open, measures the adjustment signals which are reflected at the top end portions of the plurality of probe pins, and adjusts timings at which the plurality of drivers respectively output the plurality of test signals with reference to a result of the measurement. Also, the test apparatus supplies, to the device under test, a multiple-valued signal generated by combining together the plurality of test signals output from the plurality of drivers by causing the plurality of drivers to output the plurality of test signals while the top end portions of the plurality of probe pins are kept electrically connected to a same terminal of the device under test.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on an embodiment, which does not intend to limit the scope of the present invention, but exemplifies the invention. All of the features and the combinations thereof described in the embodiment are not necessarily essential to the invention.

Figure 1:
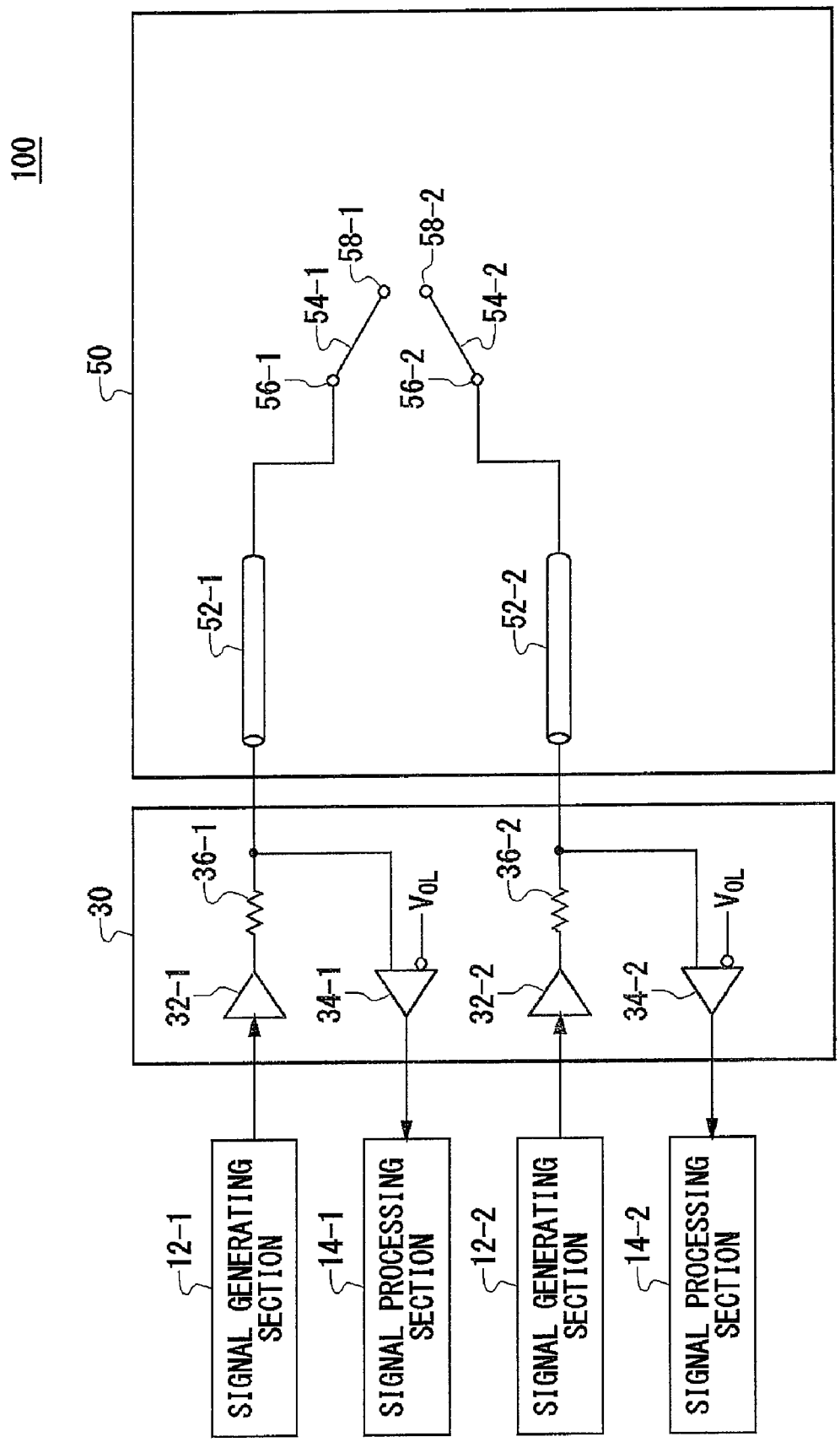
FIG. 1 illustrates an exemplary configuration of a test apparatus 100 relating to an embodiment.

FIG. 1 illustrates an exemplary configuration of a test apparatus 100 relating to an embodiment. The test apparatus 100 tests a device under test such as a semiconductor circuit by using a multiple-valued test signal. The test apparatus 100 includes therein a plurality of signal generating sections 12, a plurality of signal processing sections 14, a pin electronics section 30, and a probe card 50.

The pin electronics section 30 includes therein a plurality of drivers 32, a plurality of comparators 34, and a plurality of resistances 36. The drivers 32 are provided in a one-to-one correspondence with the signal generating sections 12.

Each signal generating section 12 generates a test signal and supplies the generated test signal to a corresponding one of the drivers 32. Each signal generating section 12 may generate a binary test signal having a logic pattern formed by binary logic values such as the H and L logics.

Alternatively, each signal generating section 12 may generate a voltage waveform which the test signal is expected to have, and supply the generated voltage waveform to the driver 32. Each driver 32 outputs a voltage determined by the received voltage waveform. Each driver 32 may output a current to be consumed by the device under test in response to the test signal.

Each driver 32 supplies the test signal to the probe card 50 via a corresponding one of the resistances 36. According to the present example, the plurality of drivers 32 supply the respective test signals to the same terminal of the device under test, so as to supply to the terminal a multiple-valued signal generated by combining together the plurality of test signals.

The probe card 50 has a plurality of transmission paths 52 and a plurality of probe pins 54 fixed therein. The transmission paths 52 are formed on the probe card 50 in a one-to-one correspondence with the drivers 32. The probe pins 54 are provided in a one-to-one correspondence with the transmission paths 52. Each transmission path 52 transmits therethrough a signal output from a corresponding one of the drivers 32 to a corresponding one of the probe pins 54.

Each probe pin 54 has a connection portion 56 and a top end portion 58. The connection and top end portions 56 and 58 may be respective ends of each probe pin 54. The connection portion 56 of each probe pin 54 is fixed to the substrate of the probe card 50, and connected to a corresponding one of the transmission paths 52.

The probe pins 54 are electrically connected at the top end portions 58 thereof to the same terminal of the device under test while the test apparatus 100 is testing the device under test. For example, the probe pins 54 are formed such that the top end portions 58 protrude from the surface of the probe card 50. In this manner, the top end portions 58 come into contact with the same terminal of the device under test which is positioned so as to oppose to the probe card 50. With such contacts, the test apparatus 100 supplies to the device under test a multiple-valued signal generated by combining together the test signals output from the drivers 32.

On the other hand, the probe pins 54 are formed such that the top end portions 58 stay electrically open while the test apparatus 100 is not testing the device under test. In other words, the top end portions 58 of the probe pins 54 are kept open while the test apparatus 100 is in the normal state. On the other hand, while the test apparatus 100 is testing the device under test, the top end portions 58 of the probe pins 54 are electrically connected to the device under test via the pads or the like of the device under test.

With the above-described configuration, the signals output from the drivers 32 are reflected at the top end portions 58 of the probe pins 54 while the test apparatus 100 is not testing the device under test. The signals reflected at the top end portions 58 of the probe pins 54 are measured by the comparators 34.

The plurality of comparators 34 are provided in a one-to-one correspondence with the plurality of drivers 32. The input end of each comparator 34 is electrically connected to the output end of a corresponding one of the drivers 32. The comparators 34 measure response signals output from the device under test while the test apparatus 100 is testing the device under test. On the other hand, while the test apparatus 100 is measuring the delay times of the transmission paths 52, the comparators 34 measure adjustment signals output from the drivers 32 and reflected waves of the adjustment signals.

According to the present example, each comparator 34 measures the signal transmitted via the connection point between the corresponding resistance 36 and the corresponding transmission path 52. When the test apparatus 100 measures the delay times of the transmission paths 52, the comparators 34 receive the adjustment signals output from the drivers 32 via the resistances 36 and also receive the reflected waves of the adjustment signals via the transmission paths 52.

According to the above description of the present example, the comparators 34 are provided in a one-to-one correspondence with the drivers 32. According to a different example, however, one comparator 34 may be provided in correspondence with a plurality of drivers 32. If such is the case, the comparator 34 is positioned such that the distance between the comparator 34 and each of the drivers 32 (i.e. the signal transmission time) is sufficiently small and can be ignored when compared with the delay times of the transmission paths 52. The single comparator 34 may sequentially measure the adjustment signal output from each of the drivers 32 and the reflected wave of the adjustment signal.

The signal processing sections 14 may calculate the delay times of the transmission paths 52 with reference to the time period from when the comparators 34 detect the adjustment signals to when the comparators 34 detect the reflected waves of the adjustment signals. For example, each signal processing section 14 may calculate the half of the time period as the delay time of a corresponding one of the transmission paths 52. Each signal processing section 14 adjusts the test signal output timing of a corresponding one of the drivers 32 in accordance with the delay time of the corresponding transmission path 52.

Having the above-described configuration, the test apparatus 100 can generate a multiple-valued (three-valued or higher) test signal with the use of the drivers 32 designed to generate binary signals and test the device under test by using the multiple-valued test signal. Also, the test apparatus 100 can easily measure the delay times of the transmission paths 52 by using the TDR method. Hence, the test apparatus 100 can easily adjust the signal output timing of each driver 32, to generate an accurate multiple-valued test signal.

According to the example described with reference to FIGS. 1 to 8, the test apparatus 100 includes therein two drivers 32, two transmission paths 52, and two probe pins 54. The test apparatus 100, however, may include therein more drivers 32, transmission paths 52 and probe pins 54. In the test apparatus 100, the numbers of other constituents such as the comparators 34 which are provided in correspondence with the above-mentioned constituents may be adjusted so as to be equal to the numbers of the above-mentioned constituents. By using the above-described constituents, the test apparatus 100 may generate a plurality of multiple-valued test signals in parallel, or generate multiple-valued test signals concurrently with binary test signals.

The resistances 36 serve to achieve impedance match between the transmission paths 52 and the drivers 32. For example, the resistances 36 may have substantially the same impedance as the transmission paths 52.

The probe card 50 is disposed on the test apparatus 100 as a replaceable constituent. A user or the like may prepare in advance a probe card 50 used when a test is carried out on the device under test by applying multiple-valued (three-valued or higher) test signals to the device under test and another probe card 50 used when a test is carried out on the device under test by using binary test signals, in place of multiple-valued test signals. The user or the like may change the probe card 50 in accordance with the type of the test to be carried out.

Figure 2:
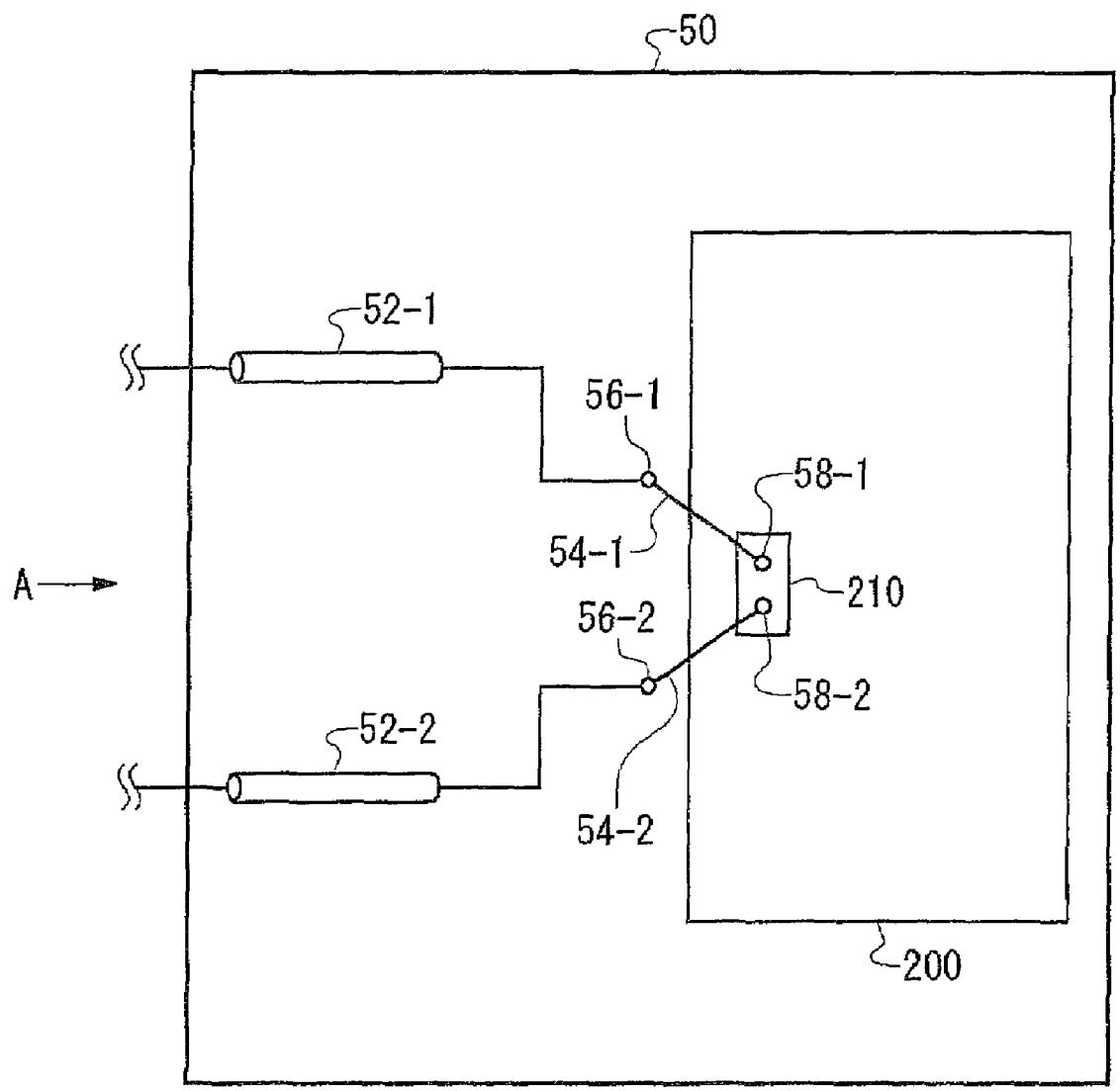
FIG. 2 illustrates a probe card 50, together with a device under test 200.

FIG. 2 illustrates the probe card 50, together with a device under test 200. The device under test 200 may be tested, for example, while being formed within a circular semiconductor wafer. The device under test 200 has a terminal 210 therein. FIG. 2 only illustrates a single terminal 210, but the device under test 200 may include therein a plurality of terminals 210.

As discussed above, when the test apparatus 100 tests the device under test 200, the probe pins 54 come in contact with the common terminal 210. In this manner, the test apparatus 100 can apply a multiple-valued test signal to the terminal 210.

Figure 3:
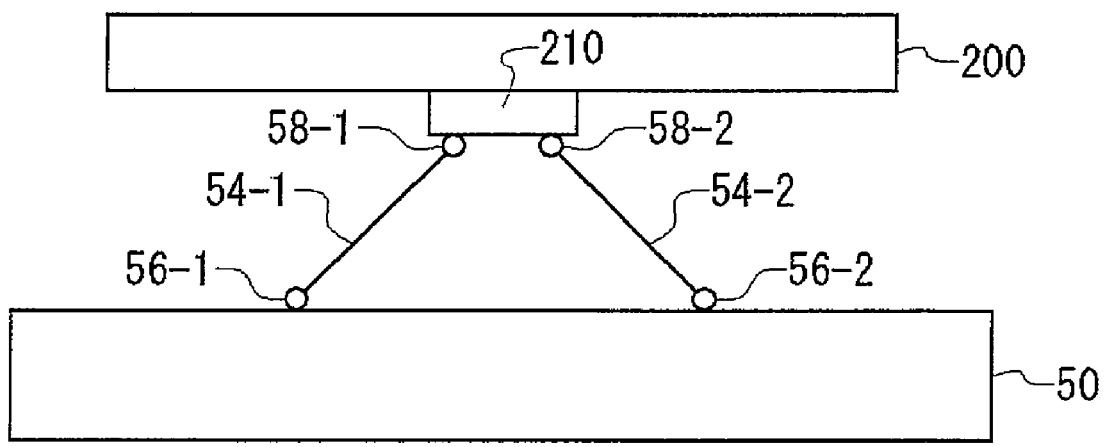
FIG. 3 is an exemplary side view illustrating the probe card 50 and the device under test 200 as seen from a position A in FIG. 2.

FIG. 3 is an exemplary side view illustrating the probe card 50 and the device under test 200 as seen from a position A in FIG. 2. According to the present example, the device under test 200 is positioned so as to oppose to the probe card 50. The probe pins 54 are formed so as to protrude from the surface of the probe card 50 towards the device under test 200, so as to be in contact with the common terminal 210 on the device under test 200.

The common terminal 210 may have such a width as to be capable of contacting with the plurality of top end portions 58. Here, the common terminal 210 contacting with a plurality of probe pins 54 may have a larger width than a terminal contacting with a single probe pin 54. The probe pins 54 may be formed such that the top end portions 58 are arranged at a smaller interval than the connection portions 56. The interval at which the top end portions 58 are arranged may be smaller than the width of the terminal 210 of the device under test 200.

The top end portions 58 of the probe pins 54 for generating a multiple-valued test signal may be arranged at a smaller interval than the top end portions 58 of the probe pins 54 for generating binary test signals in parallel. The probe pins 54 may be arranged so as to form a substantially straight line, and the terminals of the device under test 200 may be also arranged so as to form a substantially straight line. Here, these substantially straight lines may be substantially parallel to each other. When two lines of terminals are provided on the respective sides of the device under test 200, the probe pins 54 may be arranged in two separate lines so as to respectively oppose to the lines of the terminals.

The probe pins 58 may be formed in such a manner that, when the test apparatus 100 generates a multiple-valued test signal concurrently with binary test signals, the top end portions 58 of some probe pins 54 are arranged at a different interval from the top end portions 58 of the remaining probe pins 54. In other words, the probe pins 58 may be formed in such a manner that the interval at which the top end portions 58 of the probe pins 58 are arranged is set at a variety of values depending on the individual groups of the probe pins 54.

Figure 4:
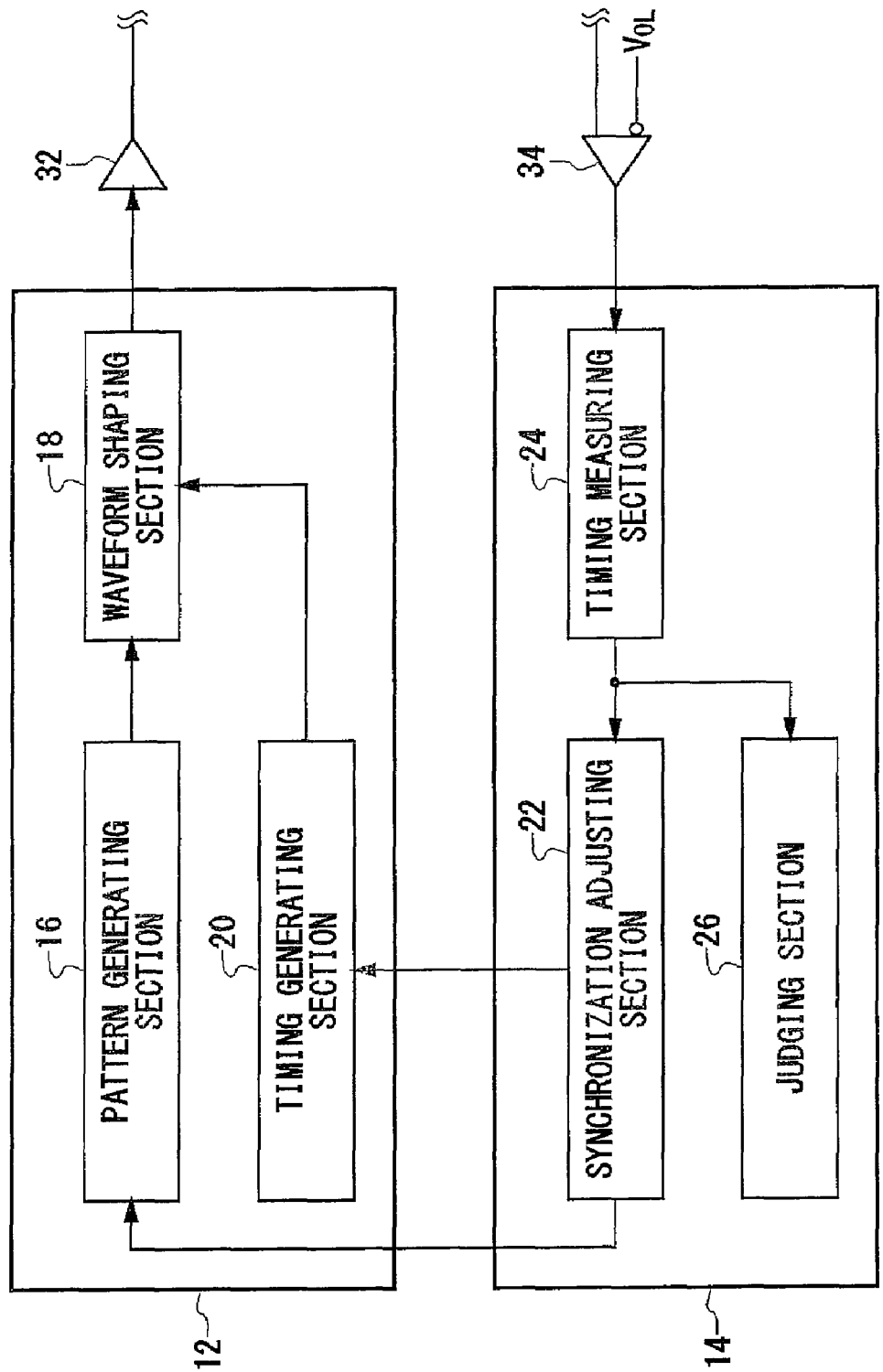
FIG. 4 illustrates exemplary configurations of each signal generating section 12 and each signal processing section 14.

FIG. 4 illustrates exemplary configurations of each signal generating section 12 and each signal processing section 14. FIG. 4 only shows one signal generating section 12 and one signal processing section 14. The signal generating sections 12 may have the same configuration, and the signal processing sections 14 may also have the same configuration.

According to the present example, each signal generating section 12 includes therein a pattern generating section 16, a timing generating section 20, and a waveform shaping section 18. The pattern generating section 16 generates logic patterns which the test and adjustment signals to be output from the signal generating section 12 are expected to have. The pattern generating section 16 may generate binary logic patterns.

The timing generating section 20 generates timing information for the test and adjustment signals to be output from the signal generating section 12. For example, the timing generating section 20 may generate timing signals designating the phases (or edge positions) of the signals and the cycle periods (or the bit rates) of the signals.

The waveform shaping section 18 generates the test and adjustment signals based on the logic patterns generated by the pattern generating section 16 and the timing signals generated by the timing generating section 20. The waveform shaping section 18 may shape the voltage waveforms of the signals. The waveform shaping section 18 supplies the generated signals to a corresponding one of the drivers 32.

A timing measuring section 24 in each signal processing section 14 receives a signal output from a corresponding one of the comparators 34. According to the present example, each comparator 34 outputs a comparison result signal having a binary logic value indicating which one of the voltage level of the signal input thereto and a reference level $V_{OL}$ given thereto is higher. The timing measuring section 24 sequentially obtains the logic value of the comparison result signal at the timings determined by the pulses of a strobe signal supplied thereto.

When the test apparatus 100 tests the device under test 200, each signal generating section 12 outputs a test signal. For example, each signal generating section 12 may output a test signal having a logic pattern designated by the user or the like. Each comparator 34 receives a response signal output from the device under test 200 in response to the test signal. Each timing measuring section 24 obtains the logic value pattern of the comparison result signal output from the corresponding comparator 34. A judging section 26 in each signal processing section 14 judges whether the device under test 200 passes or fails the test by determining whether the logic value pattern obtained by the timing measuring section 24 is the same as a predetermined expected value pattern.

When the test apparatus 100 measures the delay times of the transmission paths 52, each signal generating section 12 outputs an adjustment signal. For example, each signal generating section 12 may output a step signal or one pulse as the adjustment signal. Each comparator 34 sequentially receives the adjustment signal output from the corresponding driver 32 and the reflected wave of the adjustment signal. Each timing measuring section 24 sequentially receives the comparison result signal generated by and output from the corresponding comparator 34 for the adjustment signal and the comparison result signal generated by and output from the corresponding comparator 34 for the reflected wave. Each timing measuring section 24 sequentially obtains the logic value patterns of the respective comparison result signals.

When the test apparatus 100 measures the delay times of the transmission paths 52, the pattern generating section 16 and the timing generating section 20 respectively output a predetermined logic pattern and a predetermined timing signal so as to cause the corresponding driver 32 to output an adjustment signal. An instruction to measure the delay times of the transmission paths 52 may be issued by a synchronization adjusting section 22 in each signal processing section 14.

The synchronization adjusting section 22 adjusts the timing at which the corresponding driver 32 outputs a signal, with reference to the results obtained by the corresponding comparator 34 and the corresponding timing measuring section 24 by measuring the adjustment signal and the reflected wave of the adjustment signal. For example, the synchronization adjusting section 22 may calculate the difference in timing between when the comparator 34 detects a given edge in the adjustment signal and when the comparator 34 detects a corresponding edge in the reflected wave, based on the measurement result obtained by the timing measuring section 24. This difference in timing corresponds to the delay time of the corresponding transmission path 52.

Each synchronization adjusting section 22 adjusts the signal output timing of the corresponding driver 32, with reference to the delay time of the corresponding transmission path 52. Specifically speaking, the synchronization adjusting sections 22 adjust the signal output timings of the drivers 32 in accordance with the delay times of the transmission paths 52, so that the test signals output to the device under test 200 from the drivers 32 via the transmission paths 52 are applied to the device under test 200 at substantially the same timing.

For example, each synchronization adjusting section 22 may adjust the signal output timing of the corresponding driver 32 in accordance with a difference between the delay time of the corresponding transmission path 52 and a predetermined reference delay time. The reference delay time may be the delay time of one of the transmission paths 52. Each synchronization adjusting section 22 may adjust the signal output timing of the corresponding driver 32 by adjusting the phase of the timing signal output from the corresponding timing generating section 20.

Having the above-described configuration, the test apparatus 100 can adjust the signal output timings of the drivers 32, thereby generating an accurate multiple-valued test signal by combining the binary test signals. As a result, the test apparatus 100 can accurately test the device under test 200.

Figure 5:
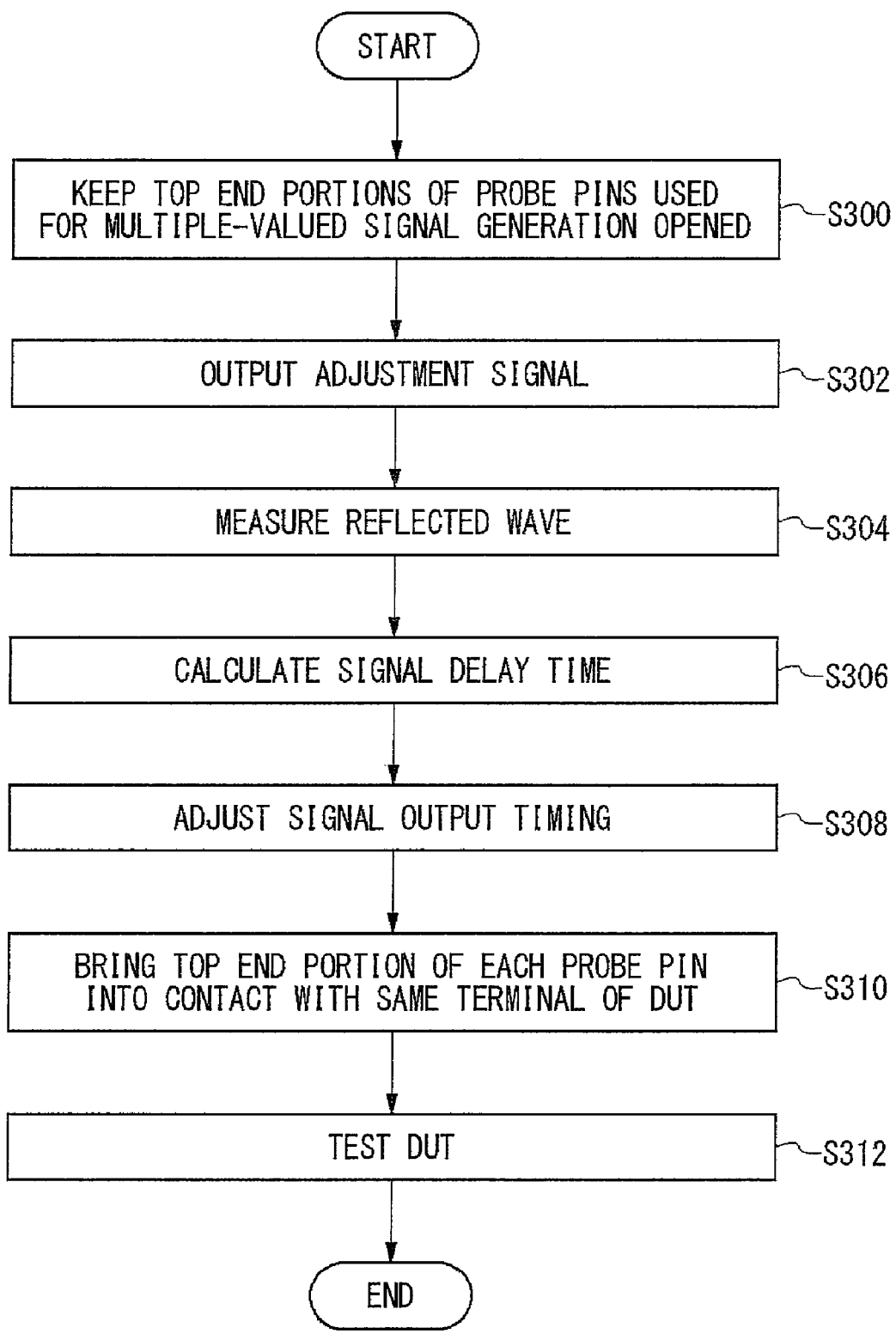
FIG. 5 is a flow chart illustrating an exemplary operation of the test apparatus 100.

FIG. 5 is a flow chart illustrating an exemplary operation of the test apparatus 100. Prior to the test of the device under test 200, the test apparatus 100 adjusts the signal output timings of the drivers 32.

To begin with, the device under test 200 is kept so as not to come in contact with the probe pins 54. The top end portions 58 of the probe pins 54 used for the multiple-valued signal generation are maintained open (step S300). Under these conditions, the drivers 32 output the adjustment signals (step S302).

After this, the comparators 34 and timing measuring sections 24 measure the adjustment signals and the reflected waves of the adjustment signals (step S304). Subsequently, the synchronization adjusting sections 22 calculate the delay times of the transmission paths 52 (step S306). For example, the synchronization adjusting sections 22 may calculate the delay times of the transmission paths 52 by calculating the difference in timing between when the comparators 34 detect the adjustment signals and when the comparators 34 detect the reflected waves. Following this, the synchronization adjusting sections 22 adjust the signal output timings of the drivers 32 with reference to the calculated delay times (step S308).

After the test apparatus 100 adjusts the drivers 32, the device under test 200 is positioned so as to oppose to the probe card 50, in such a manner that the top end portions 58 of the probe pins 54 used for generating a multiple-valued signal come in contact with the same terminal of the device under test 200 (step S310). The test apparatus 100 then causes the drivers 32 to output the test signals, thereby testing the device under test 200 (step S312). By operating in the above-described manner, the test apparatus 100 can generate an accurate multiple-valued signal for testing the device under test 200.

Figure 6:
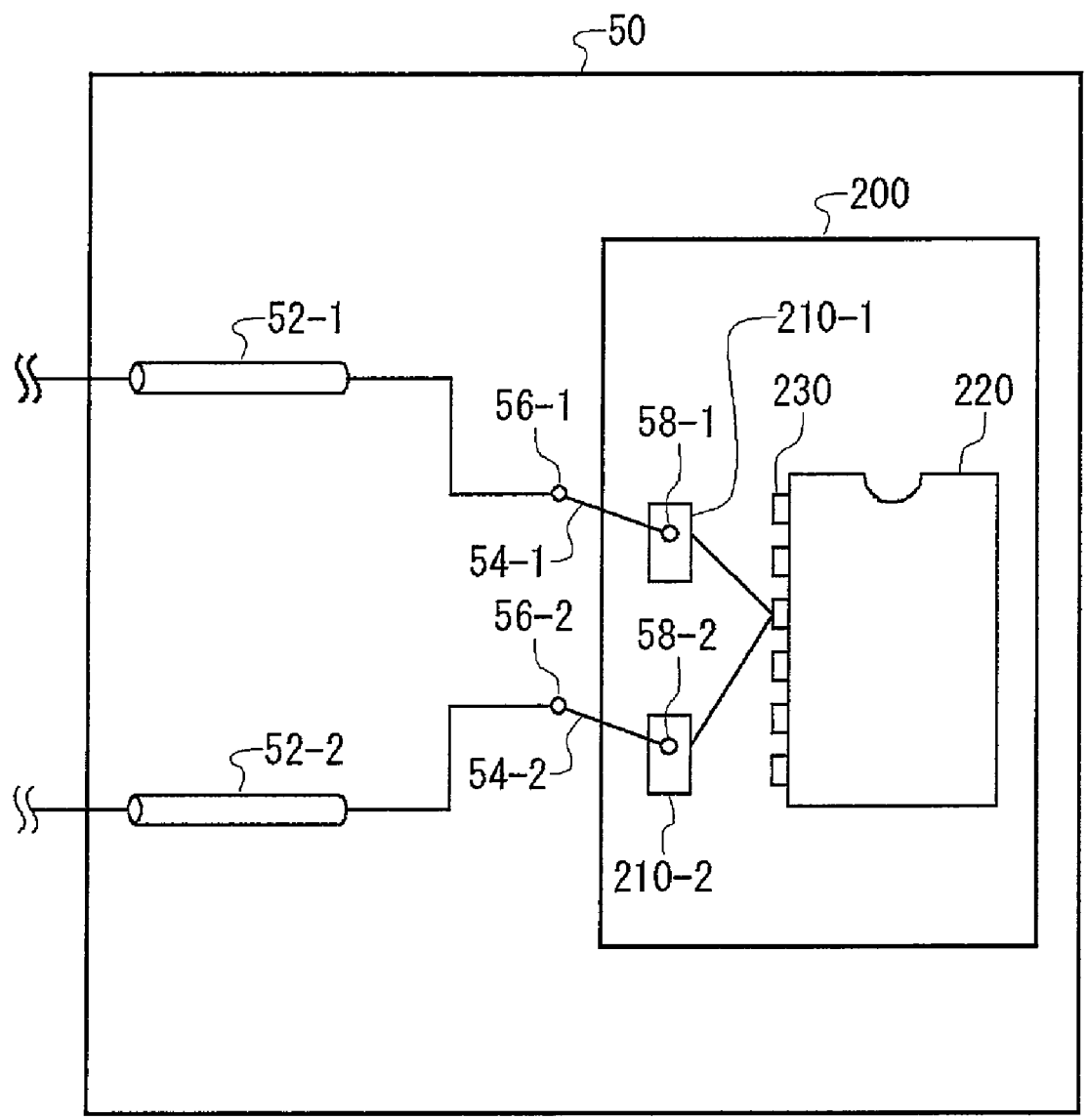
FIG. 6 illustrates a different exemplary configuration of the probe card 50.

FIG. 6 illustrates a different exemplary configuration of the probe card 50. According to the present example, the probe card 50 has a plurality of transmission paths 52 and a plurality of probe pins 54, similarly to the probe card 50 described with reference to FIGS. 1 to 5. According to the present example, however, the probe pins 54 come in contact with the terminals 210 of the device under test 200 in a one-to-one correspondence. Here, the terminals 210 may be electrodes formed on the semiconductor wafer. The terminals 210 are connected to a common input pin 230 formed within a circuit portion 220 of the device under test 200.

When the probe card 50 has the above-described configuration, the top end portions 58 of the probe pins 54 used for generating a multiple-valued test signal can be also kept open as long as the device under test 200 is not positioned so as to oppose to the probe card 50. For this reason, the test apparatus 100 can easily measure the delay times of the transmission paths 52.

Figure 7:
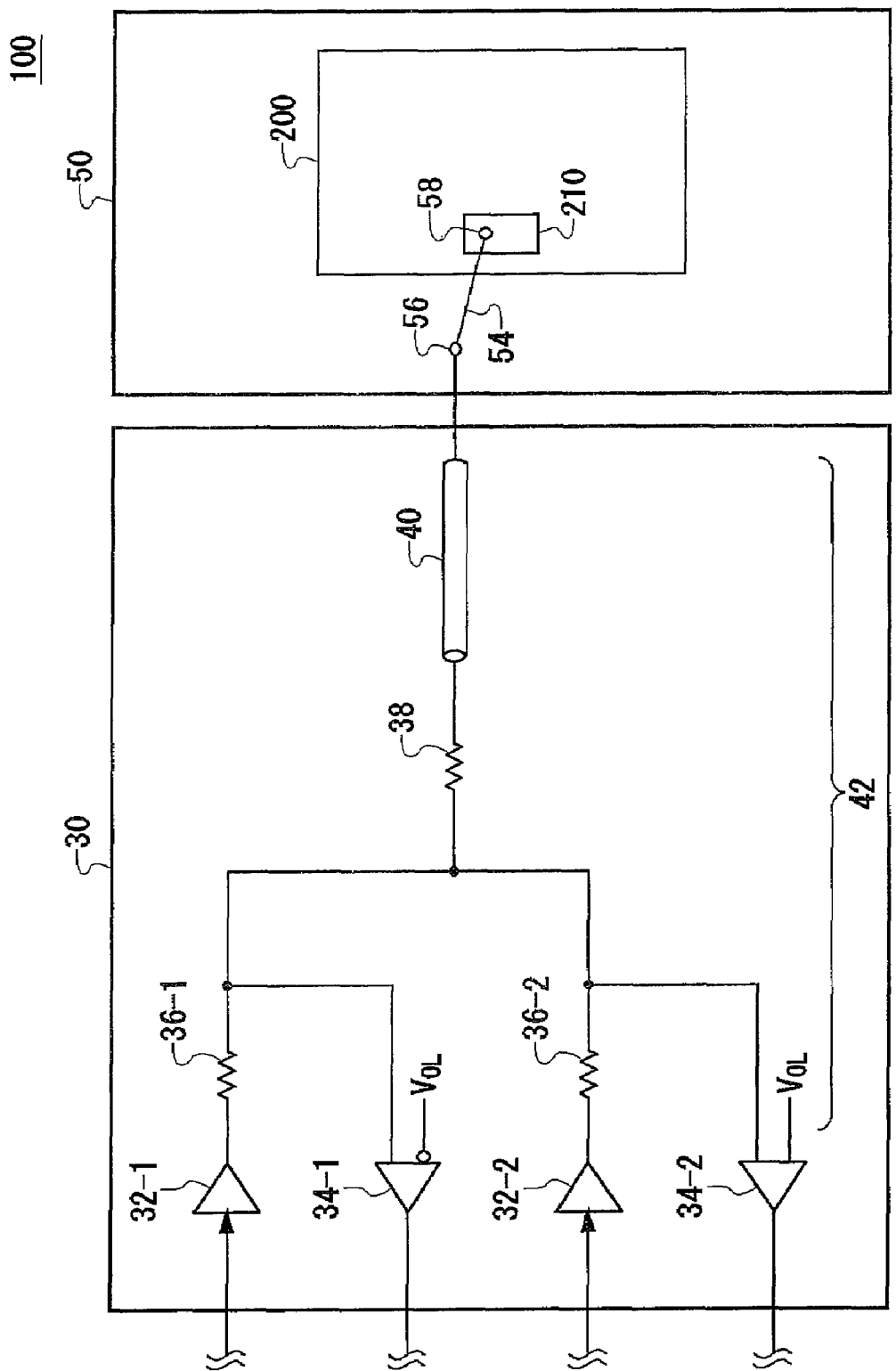
FIG. 7 illustrates different exemplary configurations of a pin electronics section 30 and the probe card 50.
Figure 8:
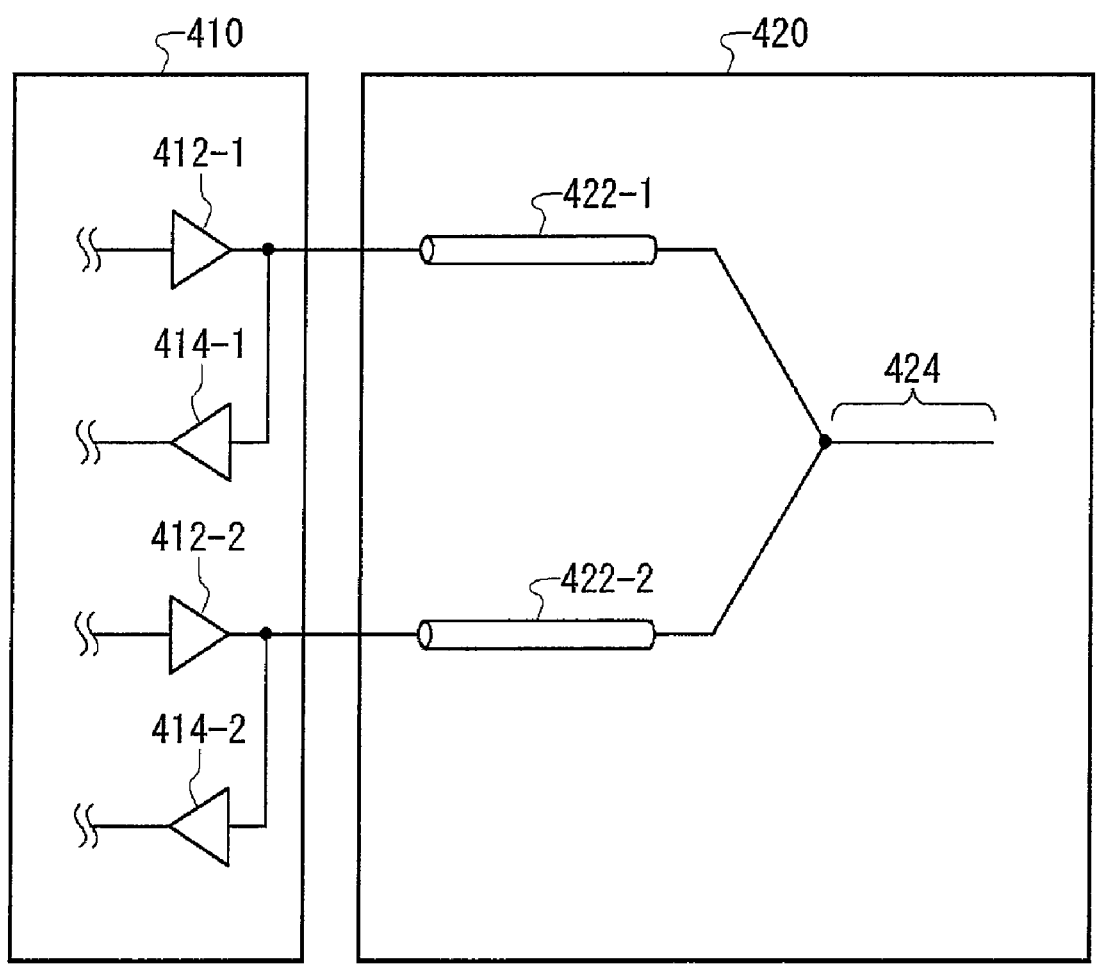
FIG. 8 illustrates an example of a test apparatus 400 generating a multiple-valued test signal.

FIG. 7 illustrates different exemplary configurations of the pin electronics section 30 and the probe card 50. According to the present example, the pin electronics section 30 includes therein a plurality of drivers 32, a plurality of comparators 34, and a wiring portion 42. The drivers 32 and comparators 34 may be the same as the drivers 32 and comparators 34 described with reference to FIGS. 1 to 5.

The wiring portion 42 electrically connects together the output ends of the drivers 32 on the substrate of the pin electronics section 30, so as to combine together test signals to generate a multiple-valued signal. The wiring portion 42 includes therein a plurality of resistances 36, a common resistance 38, and a common transmission path 40. The resistances 36 may be the same as the resistances 36 described with reference to FIGS. 1 to 5.

The common resistance 38 is connected to the resistances 36. The common transmission path 40 is electrically connected at one end thereof to the probe card 50, and at the other end thereof to the output ends of the drivers 32 via the common resistance 38. The common transmission path 40 may be positioned such that the signal delay time from the output end of each driver 32 to the common transmission path 40 is substantially the same. Specifically speaking, the common transmission path 40 is preferably positioned in the vicinity of each driver 32 to such a degree that the signal delay time from the output end of each driver 32 to the common transmission path 40 can be considered substantially zero.

The common resistance 38 achieves the impedance match between the resistance 36 provided at the output end of each driver 32 and the common transmission path 40. For example, when two drivers 32 are connected at the output ends thereof to the common resistance 38, the impedance of the common resistance 38 may be equal to half the impedance of each resistance 36.

The probe card 50 has therein a probe pin 54. The probe pin 54 may be the same as any one of the probe pines 54 described with reference to FIGS. 1 to 5. The probe pin 54 receives the multiple-valued test signal transmitted through the common transmission path 40 outside the substrate of the pin electronics section 30, and supplies the received multiple-valued test signal to the device under test 200. According to the present example, the probe pin 54 comes in contact with a terminal 210 of the device under test 200 in a one-to-one correspondence.

According to the test apparatus 100 relating to the present example, the signal delay time from each driver 32 to the common transmission path 40 is substantially zero. Hence, the test apparatus 100 can generate an accurate multiple-valued test signal by causing the drivers 32 to concurrently output the test signals. As an alternative example, the common resistance 38 and the common transmission path 40 may be formed in the probe card 50.

Although some aspects of the present invention have been described by way of an exemplary embodiment, it should be understood that those skilled in the art might make many changes and substitutions without departing from the spirit and the scope of the present invention which is defined only by the appended claims.

The above-described embodiment can generate a multiple-valued (three-valued or higher) test signal with the use of drivers designed to generate binary signals, when testing a device under test. In addition, the above-described embodiment can easily measure the delay times of transmission paths by using the TDR method. As a result, the above-described embodiment can easily adjust the signal output timings of the drivers, thereby generating an accurate multiple-valued test signal.

What is claimed is:

1. A test apparatus for testing a device under test, comprising
a plurality of drivers that respectively output a plurality of test signals;
a plurality of probe pins that are provided in a one-to-one correspondence with the plurality of drivers, each of the plurality of probe pins having a connection portion that is capable of receiving a signal output from a corresponding one of the drivers and a top end portion that is capable of being either electrically connected to a terminal of the device under test or electrically open; and
a processing section that causes the plurality of drivers to respectively output a plurality of adjustment signals, measures reflected waves of the plurality of adjustment signals from the top end portions of the plurality of probe pins when the top end portions are electrically open, and adjusts timings at which the plurality of drivers output the plurality of test signals with reference to a result of the measurement of the reflected waves, wherein the top end portions of two or more of the plurality of probe pins are capable of being electrically connected to the same terminal of the device under test, and when the top end portions of the two or more of the plurality of probe pins are electrically connected to the same terminal, the plurality of drivers respectively output the plurality of test signals at the adjusted timings such that the plurality of test signals through the two or more of the plurality of probe pins are combined into a multiple-valued signal at the same terminal.

2. The test apparatus as set forth in claim 1, further comprising a plurality of transmission paths that are provided in a one-to-one correspondence with the plurality of drivers, each of the plurality of transmission paths transmitting therethrough a signal output from a corresponding one of the plurality of drivers to a corresponding one of the plurality of probe pins, wherein the connection of each of the plurality of probe pins is connected to a corresponding one of the plurality of transmission paths, and the plurality of probe pins are formed in such a manner that the top end portions are arranged at a smaller interval than the connection portions.

3. The test apparatus as set forth in claim 2, further comprising a probe card that has the plurality of transmission paths and the plurality of probe pins fixed therein, wherein the plurality of transmission paths are formed on the probe card, and the plurality of probe pins are formed in such a manner that the connection portions are fixed on the probe card and the top end portions protrude from a surface of the probe card.

4. The test apparatus as set forth in claim 1, wherein the top end portions of the two or more of the plurality of probe pins are arranged at an interval that is smaller than a width of the same terminal.

5. The test apparatus as set forth in claim 1, further comprising a plurality of comparators that are provided in a one-to-one correspondence with the plurality of drivers, each of the plurality of comparators having an input end electrically connected to an output end of a corresponding one of the plurality of drivers, each comparator measuring a signal input thereto, wherein the processing section comprises a synchronization adjusting section that causes the plurality of drivers to respectively output a plurality of adjustment signals, causes the plurality of comparators to measure reflected waves of the plurality of adjustment signals from the top end portions of the plurality of probe pins when the top end portions are electrically open, and adjusts timings at which the plurality of drivers output the plurality of test signals with reference to a result of the measurement of the reflected waves.

6. The test apparatus as set forth in claim 5, wherein the synchronization adjusting section adjusts the timing at which each of the plurality of drivers outputs the test signal with reference to (i) a timing at which a corresponding one of the plurality of comparators detects the adjustment signal output from the driver and (ii) a timing at which the corresponding comparator detects the adjustment signal which is reflected at the top end portion of a corresponding one of the plurality of probe pins.

* * * * *